United States Patent
Lai et al.

(10) Patent No.: US 12,525,550 B2
(45) Date of Patent: Jan. 13, 2026

(54) SEAL RING FOR SEMICONDUCTOR DEVICE WITH GATE-ALL-AROUND TRANSISTORS

(71) Applicant: Taiwan Semiconductor Manufacturing Company, Ltd., Hsin-Chu (TW)

(72) Inventors: Yen Lian Lai, New Taipei (TW); Chun Yu Chen, Hsinchu (TW); Yung Feng Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 648 days.

(21) Appl. No.: 17/832,866

(22) Filed: Jun. 6, 2022

(65) Prior Publication Data

US 2023/0040387 A1 Feb. 9, 2023

Related U.S. Application Data

(60) Provisional application No. 63/230,156, filed on Aug. 6, 2021.

(51) Int. Cl.
*H01L 23/00* (2006.01)
*H01L 23/58* (2006.01)
(Continued)

(52) U.S. Cl.
CPC .......... *H01L 23/564* (2013.01); *H01L 23/562* (2013.01); *H01L 23/585* (2013.01); *H10D 30/014* (2025.01); *H10D 30/031* (2025.01); *H10D 30/43* (2025.01); *H10D 30/6713* (2025.01); *H10D 30/6729* (2025.01); *H10D 30/6735* (2025.01); *H10D 30/6757* (2025.01); *H10D 62/121* (2025.01)

(58) Field of Classification Search
CPC .... H10D 30/43; H10D 30/67; H10D 30/6735; H10D 62/121; H01L 23/562; H01L 23/585

See application file for complete search history.

(56) References Cited

U.S. PATENT DOCUMENTS 11,158,634 B1 10/2021 Huang et al.
11,450,665 B2 9/2022 Chiang et al.
(Continued)

FOREIGN PATENT DOCUMENTS

TW 200847330 A 12/2008

*Primary Examiner* — Tuan A Hoang
(74) *Attorney, Agent, or Firm* — HAYNES AND BOONE, LLP

(57) ABSTRACT

The present disclosure provides a semiconductor structure. The semiconductor structure includes a substrate; and a seal ring region enclosing a circuit region disposed over the substrate. The seal ring region further includes a fin ring protruding from the substrate having a first width; an isolation ring disposed over the substrate and adjacent to the fin ring; a gate ring disposed over the fin ring having a second width, wherein the second width is less than the first width; an epitaxial ring disposed between the fin ring and the isolation ring; and a contact ring lands on the epitaxial ring and the isolation ring. Each of the fin ring, the isolation ring, the epitaxial ring, and the contact ring extends parallel to each other and fully surrounds the circuit region to form a closed loop.

20 Claims, 23 Drawing Sheets

(51) Int. Cl.
    *H10D 30/01*     (2025.01)
    *H10D 30/43*     (2025.01)
    *H10D 30/67*     (2025.01)
    *H10D 62/10*     (2025.01)

(56) References Cited

U.S. PATENT DOCUMENTS

| | | |
|---|---|---|
| 11,532,556 B2 | 12/2022 | Huang et al. |
| 2014/0367835 A1* | 12/2014 | Wei ................. H01L 23/585 |
| | | 438/618 |
| 2015/0255593 A1* | 9/2015 | Yu ................... H10D 30/0243 |
| | | 257/401 |
| 2016/0172359 A1* | 6/2016 | Yoon ................ H10D 84/834 |
| | | 257/401 |

\* cited by examiner

SEAL RING FOR SEMICONDUCTOR DEVICE WITH GATE-ALL-AROUND TRANSISTORS

PRIORITY

This application claims the benefits to U.S. Provisional Application Ser. No. 63/230,156 filed Aug. 6, 2021, the entire disclosure of which is incorporated herein by reference.

BACKGROUND

In semiconductor technologies, a semiconductor wafer is processed through various fabrication steps to form integrated circuits (IC). Typically, several circuits or IC dies are formed onto the same semiconductor wafer. The wafer is then diced to cut out the circuits formed thereon. To protect the circuits from moisture degradation, ionic contamination, and dicing processes, a seal ring is formed around each IC die. This seal ring is formed during fabrication of the many layers that comprise the circuits, including both the front-end-of-line (FEOL) processing and back-end-of-line processing (BEOL). The FEOL includes forming transistors, capacitors, diodes, and/or resistors onto the semiconductor substrate. The BEOL includes forming metal layer interconnects and vias that provide routing to the components of the FEOL.

Although existing seal ring structures and fabrication methods have been generally adequate for their intended purposes, improvements are desired. For example, it is desired to improve seal ring stability in gate-all-around devices, such as nanosheet devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
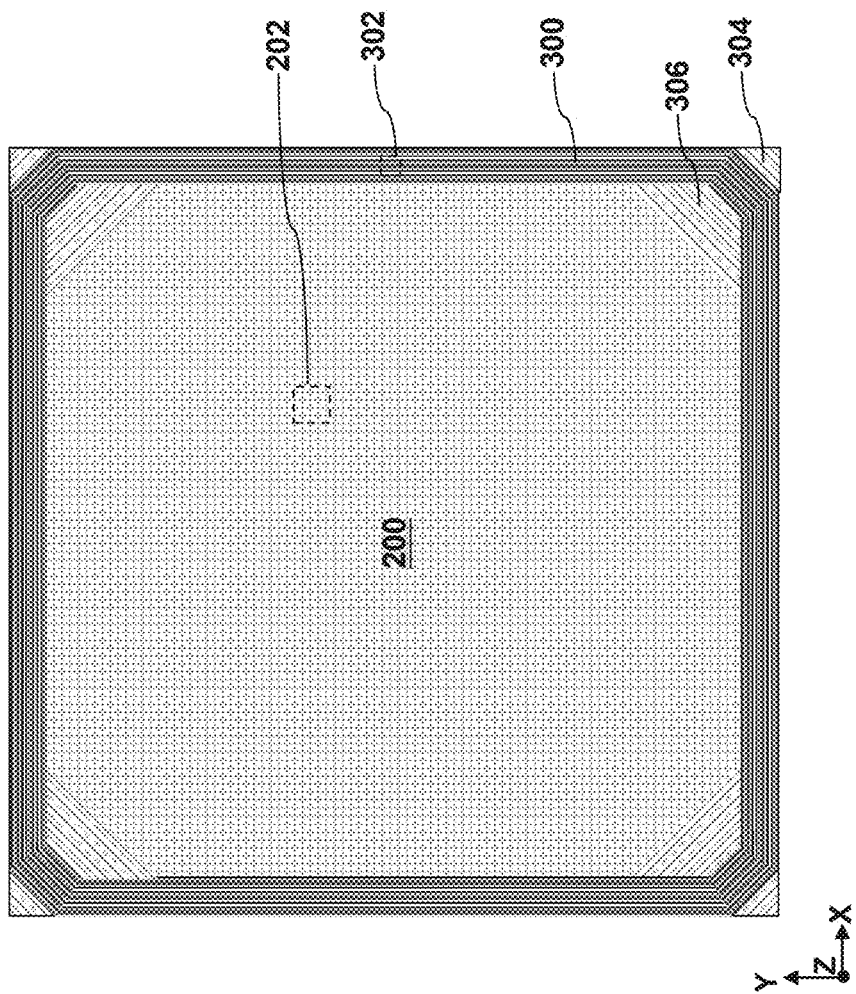
FIG. 1 is a top plan view of a semiconductor structure with a seal ring region, according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application generally relates to semiconductor structures and fabrication processes, and more particularly to a seal ring region of a semiconductor structure that is compatible with a circuit region of the semiconductor structure having gate-all-around (GAA) transistors. In other words, the seal ring region surrounds one or more circuit regions that include GAA transistors. A GAA transistor (or GAA device) refers to a vertically-stacked horizontally-oriented multi-channel transistor, such as a nanowire transistor or a nanosheet transistor. GAA transistors are promising candidates to take complementary metal-oxide-semiconductor to the next stage of the roadmap due to their better gate control ability, lower leakage current, and fully FinFET device layout compatibility. However, many challenges remain, one of which is how to make reliable seal ring regions that are compatible with the processes for making GAA transistors. The present disclosure provides such seal ring regions.

According to an embodiment of the present disclosure, the seal ring region is initially provided with stacked semiconductor layers (such as alternately stacked silicon and silicon germanium layers) and dummy gate structures (for example, polysilicon (or poly) gates) above the stacked semiconductor layers. The seal ring region subsequently go through other transistor formation processes simultaneously with the circuit region, such as forming fins, forming isolation structures between fins, etching the fins to form trenches, forming epitaxial features in the trenches, and replacing the sacrificial gate structures with metal gate structures. The BEOL processes may be performed thereafter. The present embodiments selectively perform one/or more afore mentioned transistor formation processes in the seal ring region to improve the stability and reliability of the seal ring region.

The fins, isolation structures, trenches, epitaxial features, sacrificial gate structures, and metal gate structures in the seal ring region are each formed into a closed ring shape (loop) enclosing the entire circuit region and are thereby also referred as fin rings, isolation rings, trench rings, epitaxial rings, sacrificial gate rings, and metal gate rings, respectively. On the other hand, the fins, isolation structures, trenches, epitaxial features, sacrificial gate structures, and metal gate structures in the device region are formed into straight lines and are enclosed by each of the as fin rings, isolation rings, trench rings, epitaxial rings, sacrificial gate rings, and metal gate rings in the seal ring region. The present embodiments provide semiconductor structures, including the fin rings, isolation rings, trench rings, epitaxial rings, and metal gate rings, with improved stability and reliability.

Those of ordinary skill in the art should appreciate that they may readily use the present disclosure as a basis for designing or modifying other processes and structures for carrying out the same purposes and/or achieving the same advantages of the embodiments introduced herein.

FIG. 1 is a top plan view of the semiconductor structure 100 according to the present disclosure. The semiconductor structure 100 (such as a manufactured wafer or a part thereof) includes a seal ring region 300 that encloses a circuit region (or device region, IC die) 200. In some embodiments, the semiconductor structure 100 may include other seal ring region(s) enclosing the seal ring region 300 or other seal ring region(s) enclosed by the seal ring region 300. Also, seal ring region 300 may enclose other circuit region(s). The circuit region 200 may include any circuits, such as memory, processor, transmitter, receiver, and so on. The exact functionality of the circuit region 200 is not limited by the present disclosure. In the present disclosure, the circuit region 200 includes GAA transistors.

In the present embodiment, the seal ring region 300 has a rectangular or substantially rectangular periphery. The seal ring region 300 further includes four outer corner seal ring (CSR) structures 304 and four inner CSR structures 306 at the four interior corners of the rectangular or substantially rectangular periphery. In an embodiment, the outer CSR structure 304 is triangular or substantially triangular and the inner CSR structure 306 is trapezoid or substantially trapezoid shape. The outer CSR structure 304 and the inner CSR structure 306 provide various mechanical and structural benefits to the seal ring region 300, such as preventing layer peeling at the corner of the chips during dicing processes. In other embodiments, the outer CSR structures 304 and the inner CSR structure 306 may be omitted in the seal ring region 300. Further, the seal ring region 300 may have non-rectangular shape. In the present embodiment, the seal ring region 300 fully surrounds (or enclosing) the circuit region 200 and forms a sealed (or closed) ring (or loop). In other embodiments, the seal ring region 300 may provide openings in selected locations in selected layers to allow interconnects between the circuit region 200 and other circuit regions not shown in FIG. 1.

Figure 2:
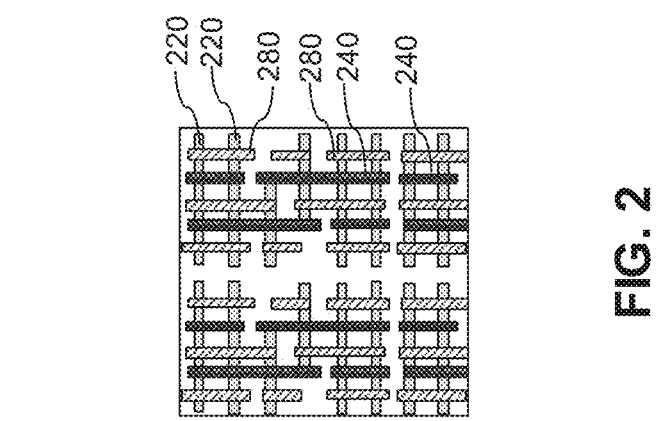
FIG. 2 is an enlarged top plan view of area 202 in FIG. 1, according to various embodiments of the present disclosure.

Referring to FIG. 2, the circuit region 200 includes fin structures (semiconductor layers) 220 oriented lengthwise along the "x" direction, and further includes gate structures 240 and contacts 280 oriented lengthwise along the "y" direction. The above elements form a matrix, and transistors (such as GAA transistors) are formed in the intersections between the fin structures 220 and the gate structures 240.

Figure 3:
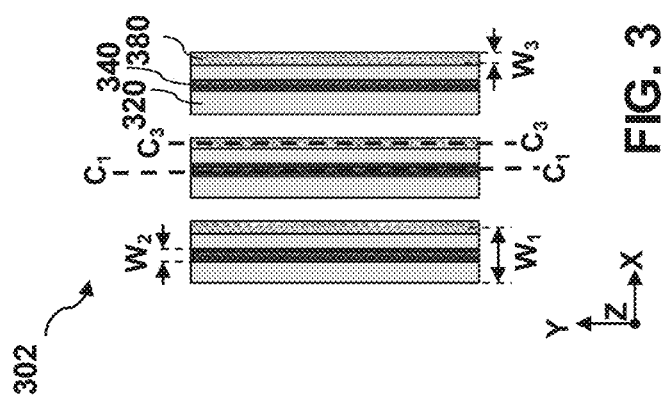
FIG. 3 is an enlarged top plan view of area 302 in FIG. 1, according to various embodiments of the present disclosure.

Referring to FIG. 3, the zoomed-in view of the area 302, the seal ring region 300 includes fin rings (or semiconductor rings) 320, gate rings 340 disposed over the fin rings 320, and contact rings 380 partially disposed over the fin rings 320. Each of the fin rings 320, gate rings 340, and contact rings 380 (as well as the base isolation ring 330, dummy fin rings 332, dielectric helmets 334, the first epitaxial rings 360, and the second epitaxial ring 362 shown in FIG. 17) forms a closed ring shape (or a loop) completely surrounding the entire circuit region 200. In the depicted embodiment, each of the gate rings 340 is disposed completely within the boundary of the semiconductor layer 324 from the top view. Longitudinal edges of gate rings 340 are within the longitudinal edges of the fin rings 320. In other words, the gate ring 340 spans widthwise within the width of the fin ring 320. A center line $c_1$-$c_1$ of the fin ring 320 overlaps with the center line $c_2$-$c_2$ (not shown) of the gate ring 340. A width $w_2$ of each gate rings 340 is narrow than a width $w_1$ of each fin rings 320 from the top view. In some embodiments, the width $w_2$ is about 25% to about 40% of the width $w_1$. In an example, the width $w_1$ is about 200 nm to about 400 nm, and the width $w_2$ is about 50 nm to about 150 nm. The width $w_1$ and the width $w_2$ is measured along a direction perpendicular to the longitudinal edges of the fin ring 320 and the gate ring 340, respectively.

Still referring to FIG. 3, each of the contact rings 380 are partially disposed over the fin rings 320. A first longitudinal edge of each contact ring 380 is within the longitudinal edges of the fin rings 320. A second longitudinal edge of each contact ring 380 is outside (or beyond) the longitudinal edge of the fin rings 320. A center line $c_3$-$c_3$ of the contact ring 380 overlaps with a longitudinal edge of the fin ring 320, such as the longitudinal edge closer to the circuit region 200 as depicted in FIG. 3. A width $w_3$ of each contact ring 380 is less than the width $w_1$. In some embodiments, the width $w_3$ is about 15% to about 25% if the width $w_1$. In an example, the width $w_3$ is about 40 nm to about 80 nm. The fin rings 320, the gate rings 340, and the contact rings 380 are configured as such to provide better (e.g., wider) landing for the interconnects disposed subsequently thereover, thereby improving the stability and reliability of the seal ring region 300. The width $w_3$ is measured along a direction perpendicular to the longitudinal edges of the contact ring 380.

Figure 4A:
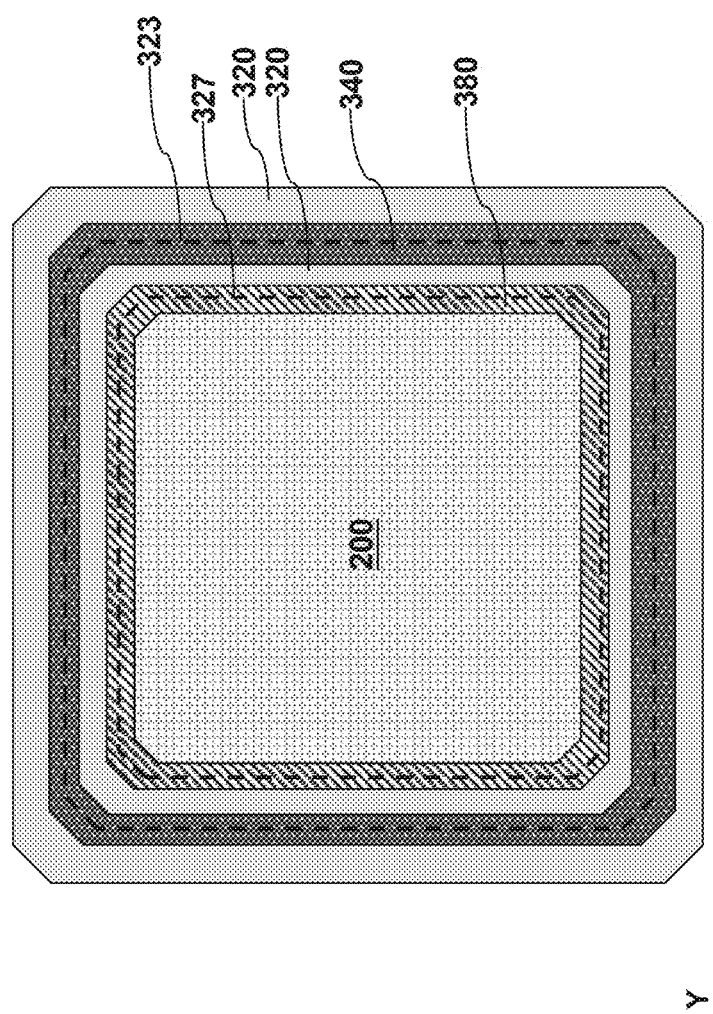
FIGS. 4A and 4B are top plan views of the semiconductor structure in FIG. 1, according to various embodiments of the present disclosure.
Figure 4B:
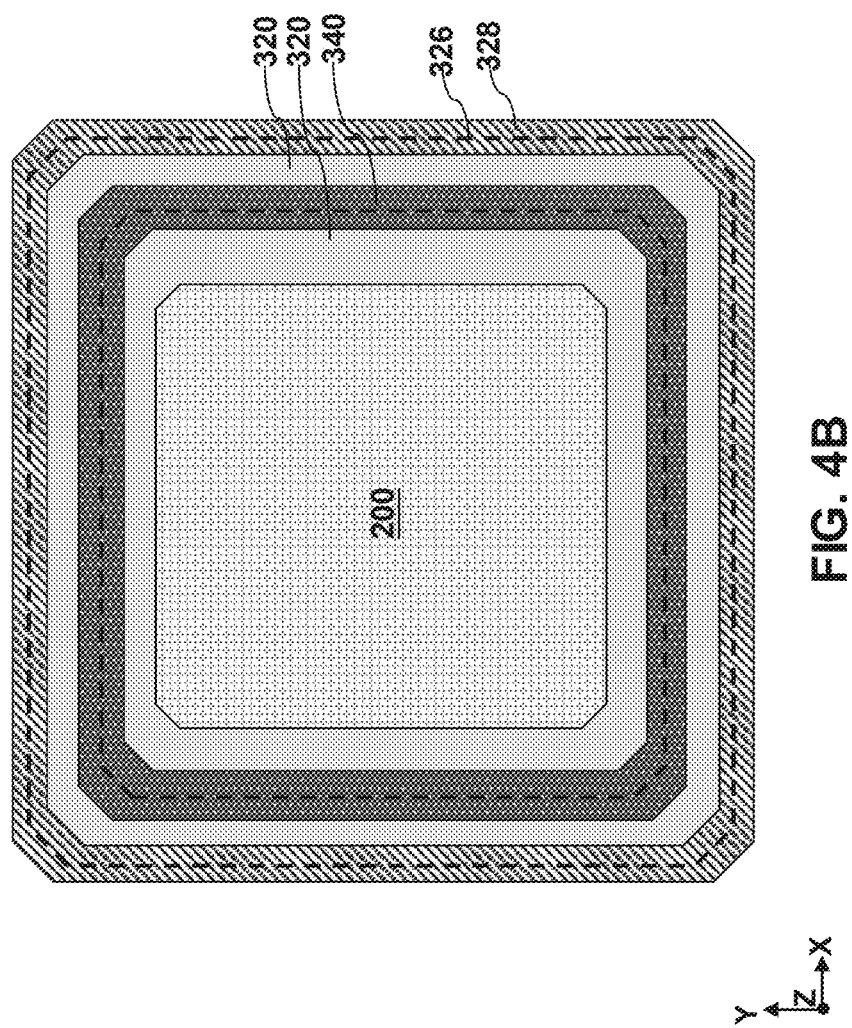
Figure 19:
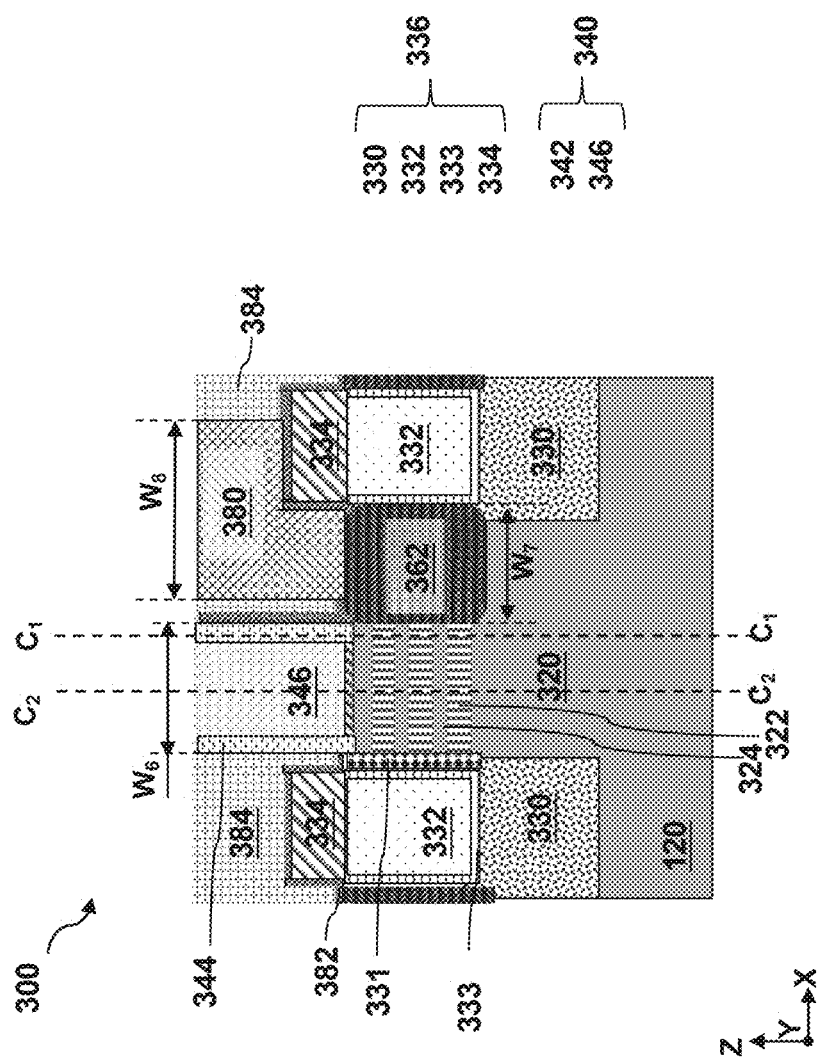
Figure 23:
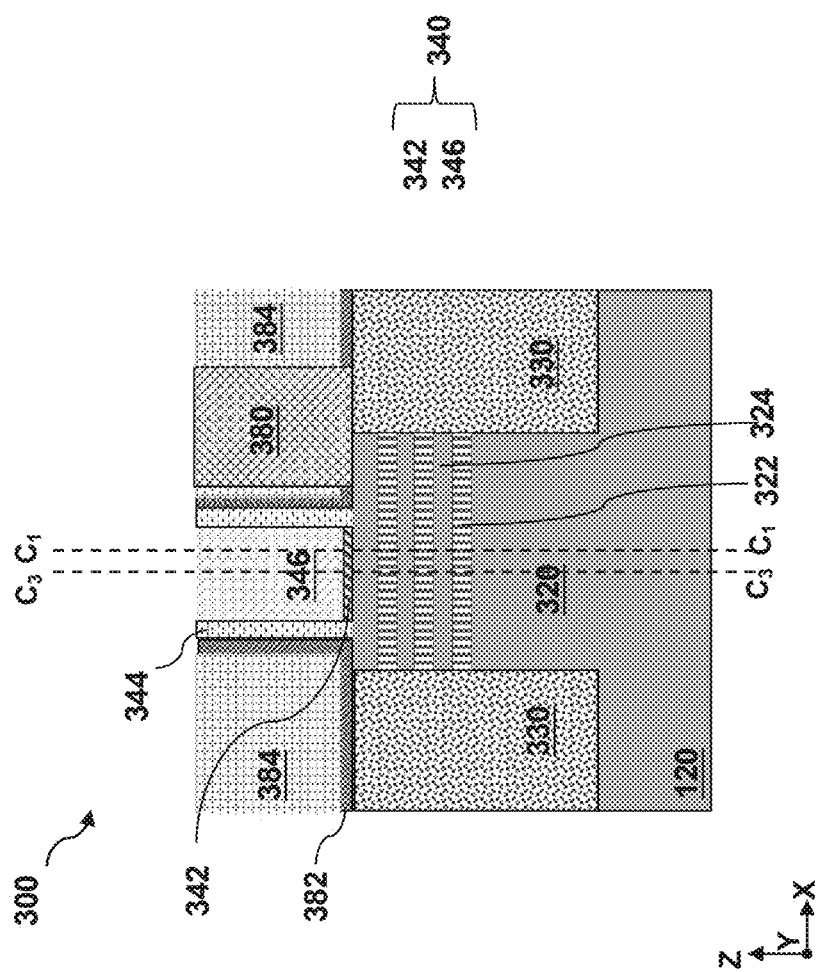

FIGS. 4A and 4B are top plan views of one fin ring 320, one gate ring 340 over the fin ring 320, and one contact ring 380 partially over the fin ring 320 around the entire circuit region 200. In other embodiments, the seal ring region 300 may include more than one fin rings 320, gate rings 340, and or contact rings 380. The fin ring 320, the gate ring 340, and the contact ring 380 are concentric rings, each of which forms a closed loop around the circuit region 200. The gate ring 340 overlaps with the fin ring 320 and the contact ring partially overlaps with fin ring 320, while the gate ring 340 and the contact ring 380 are spaced apart. Referring to FIGS. 4A and 4B, the fin ring 320 and the gate ring 340 share the same center ring 323. The center ring 327 of the contact ring is the interior edge of the fin ring 320 in the embodiment depicted in FIG. 4A. The center ring 327 of the contact ring is the exterior edge of the fin ring 320 in the embodiment depicted in FIG. 4B. In some embodiments, a first contact ring 380 may be disposed over the interior edge and a second contact ring 380 may be disposed over the exterior edge of the fin ring 320. In some embodiments, the center ring of the gate stack may not align with the center ring of the fin ring 320, such as depicted in FIGS. 19 and 23. As used herein, the center ring is defined as the closed ring longitudinally cutting the fin ring 320, the gate ring 340, or the contact ring 380 in two portions, where the two portions have the same width measured along a line perpendicular to the center line.

Figure 5:
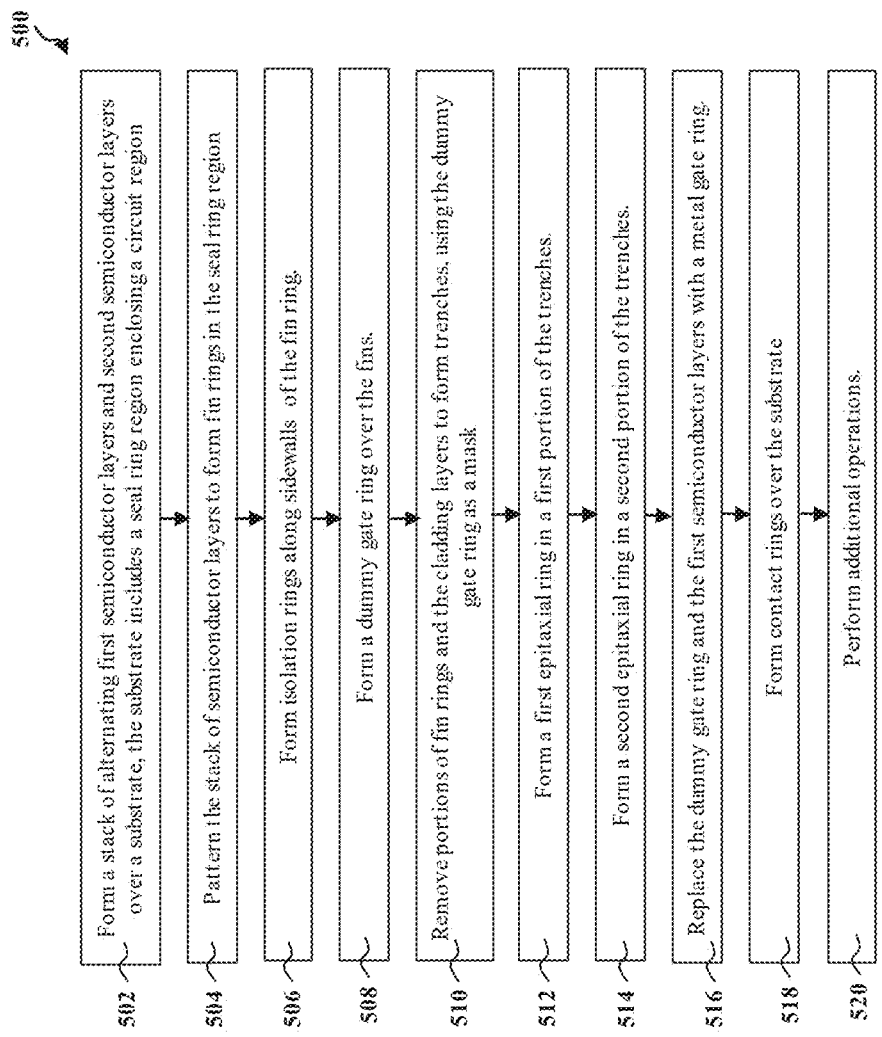
FIG. 5 is a flowchart showing a method of making the semiconductor structures in FIG. 1.

FIG. 5 is a flow chart of a method 500 for fabricating the semiconductor structure 100 according to various aspects of the present disclosure. Additional operations can be provided before, during, and after method 500, and some of the operations described can be moved, replaced, or eliminated for additional embodiments of method 500. Method 500 is described below in conjunction with FIGS. 6-23 that illustrate cross-sectional views of the semiconductor structure 100 in the seal ring region 300 at various steps of fabrication according to the method 500, in accordance with some embodiments. The circuit region 200 is subject to the same processes simultaneously. The details of the method 500 in the circuit region 200 are discussed in the U.S. Application titled with "Seal Ring for Semiconductor Device with Gate-All-Around Transistors", assigned to the same assignee, and having application Ser. No. 17/723,193 filed on Apr. 18, 2022, the entirety of which is incorporated herein as a reference. The components (e.g., the fin ring 320, the gate ring 340, the first epitaxial ring 360, the second epitaxial ring 362, and the contact ring 380) formed in method 500 in the seal ring region 300 do not function electronically as transistors. Rather, the components in the seal ring region 300 serves (together with the interconnects formed thereover) to seal and protect the circuit region 200.

Figure 6:
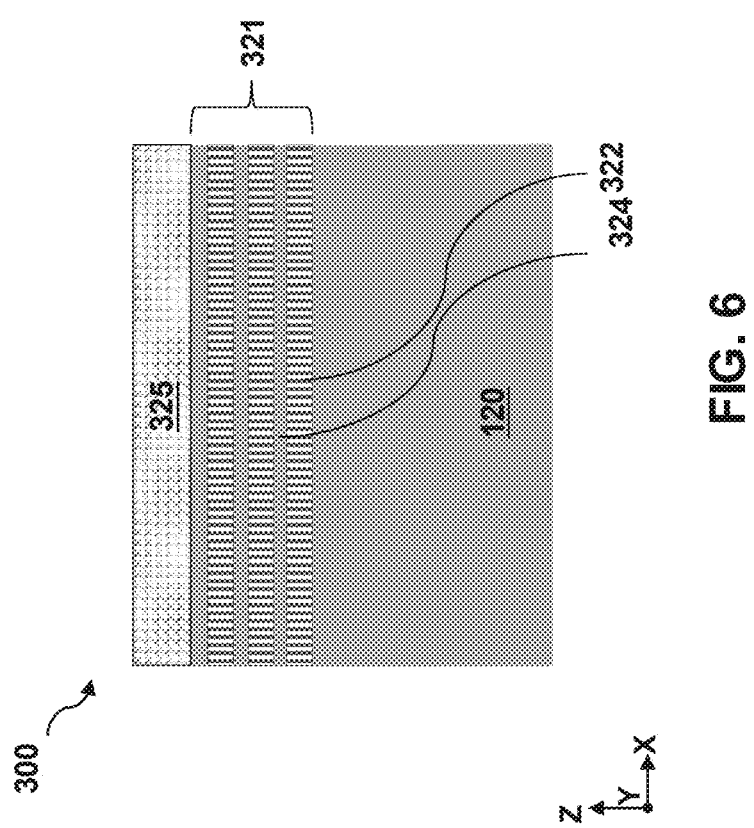
FIGS. 6, 7, 8, 9, 10, 11, 12, 13, 14, 15, 16, and 17 are cross-sectional views of the semiconductor structure in FIG. 1, during various fabrication stages according to various embodiments of the method 500 in FIG. 5.

At operation 502, referring to FIGS. 5 and 6, the method 500 forms a stack 321 of semiconductor layers 322 and 324 over a substrate 120. The substrate 120 is a silicon substrate in the present embodiment. The substrate 120 may alternatively include other semiconductor materials in various embodiments, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. The substrate 120 may include doped semiconductor layers such as P-wells and/or N-wells. Furthermore, the substrate 120 may be a semiconductor on insulator substrate such as silicon on insulator (SOI) substrate.

Semiconductor layers 322 and 324 may include the same or different semiconductor materials such as silicon, silicon germanium, germanium, or other suitable semiconductor materials. Further, semiconductor layers 322 and 324 may include N-type doped regions formed by doping the semiconductor material with n-type dopants, such as phosphorus, arsenic, other n-type dopant, or combinations thereof; and/or P-type doped regions formed by doping the semiconductor material with p-type dopants, such as boron, indium, other p-type dopant, or combinations thereof.

In some embodiments, the semiconductor layers 322 and 324 are epitaxially grown into an interleaving (or alternating) configuration. The number of semiconductor layers 322 and 324 may range from 2 to 10 in some embodiments. Semiconductor layers 322 and 324 include different materials, constituent atomic percentages, constituent weight percentages, thicknesses, and/or characteristics to achieve desired etching selectivity during an etching process.

Figure 7:
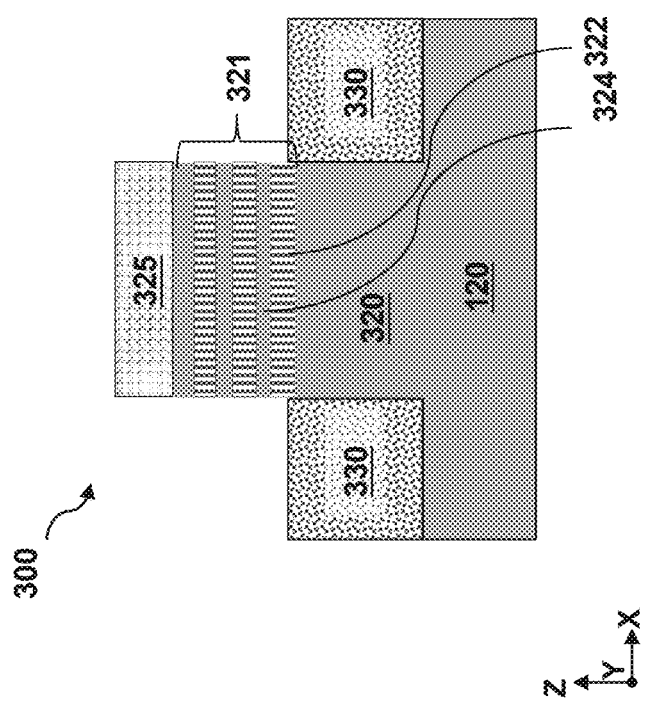

At operation 504, referring to FIGS. 5 and 7, the method 500 forms a fin ring 320 by patterning the stack of semiconductor layers 322 and 324 in the seal ring region 300. The fin ring 320 is formed into a closed ring shape that surrounds the entire circuit region 200. As illustrated in FIG. 7, the fin ring 320 includes the patterned stack 321 (having semiconductor layers 322 and 324) and one or more patterned hard mask 325. The fin ring further includes a fin base under the patterned stack 321 connecting the semiconductor substrate 120. The fin ring 320 may be patterned by any suitable method. For example, the fin ring 320 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the stack 321 and patterned using a photolithography process. Spacers are formed alongside the patterned sacrificial layer using a self-aligned process. The sacrificial layer is then removed, and the remaining spacers, or mandrels, may then be used as a masking element for patterning the fin ring 320. For example, the masking element may be used for etching recesses into the stacks 321 and the substrate 120, leaving the fin ring 320 on the substrate 120. The etching process may include dry etching, wet etching, reactive ion etching (RIE), and/or other suitable processes.

At operation 506, referring to FIGS. 5 and 7-10, the method 500 forms isolation rings 336 in the seal ring region 300. The isolation rings 336 include base isolation rings 330, dummy fin rings 332 and dielectric helmets 334. The dummy fin ring 332 may further include a dielectric layer 333. The isolation rings 336 are disposed between and thereby isolating adjacent fin rings 320. The forming of the isolation rings 336 may involve a variety of processes, such as shown in FIGS. 7-10.

Referring to FIG. 7, the base isolation rings 330 extends parallel with the fin ring 320 and each of which forms a closed ring shape around the circuit region 200. In an embodiment, the base isolation rings 330 can be formed by filling the trenches adjacent to the fin ring 320 with insulator material (for example, by using a CVD process or a spin-on glass process), performing a chemical mechanical polishing (CMP) process to remove excessive insulator material and/or planarize a top surface of the insulator material layer, and etching back the insulator material layer to form base isolation rings 330. The base isolation rings 330 may include silicon oxide, silicon nitride, silicon oxynitride, other suitable isolation material (for example, including silicon, oxygen, nitrogen, carbon, or other suitable isolation constituent), or combinations thereof. The base isolation rings 330 may include shallow trench isolation (STI), deep trench isolation (DTI), or other types of isolation.

Figure 8:
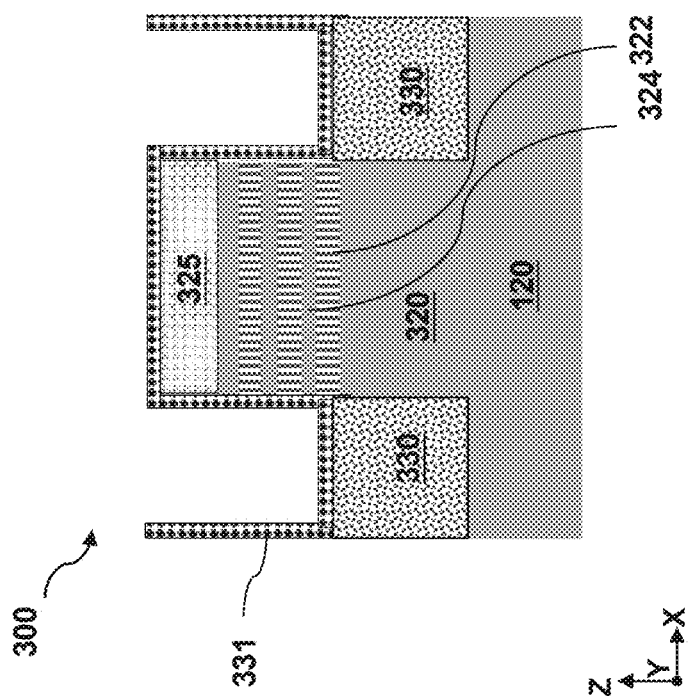

Referring to FIG. 8, a cladding layer 331 is formed on top and sidewalls of the fin rings 320. In an embodiment, the cladding layer 331 may include SiGe and may be deposited using CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), other suitable methods, or combinations thereof.

Figure 9:
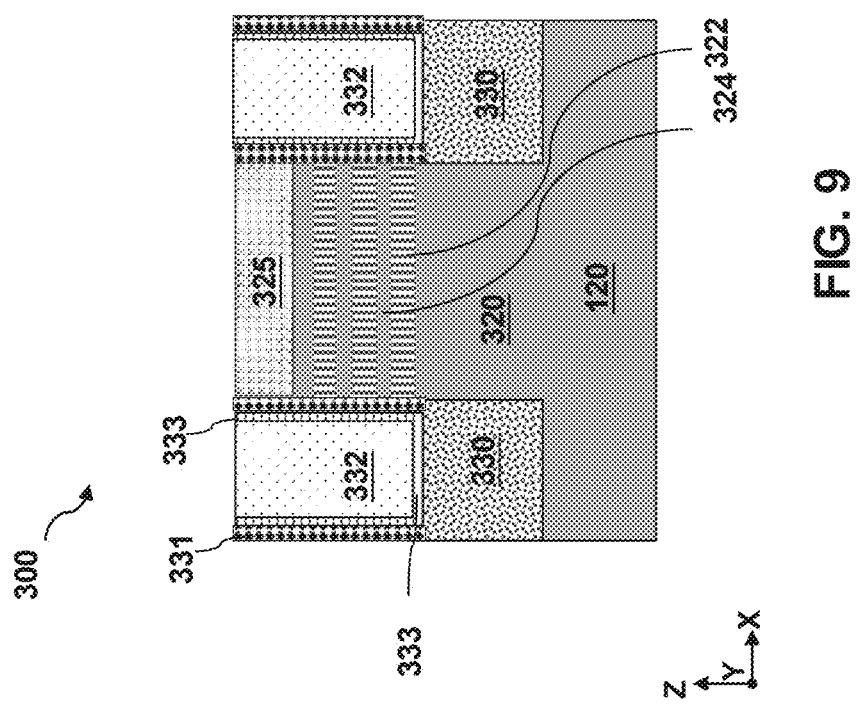

Referring to FIG. 9, the method 500 forms dummy fin rings 332 in the seal ring region 300. A portion of the cladding layer 331 over the base isolation ring 330 is removed prior to the forming of the dummy fin rings 332, while portions of the cladding layer 331 over sidewalls of the stack 321 remain intact. Thereafter, the dummy fin rings 332 may be deposited using a flowable CVD (FCVD) process or other types of methods. The dummy fin rings 332 extends parallel to the fin ring 320, each of which forms a closed ring shape around the circuit region 200. The dummy fin rings 332 may include silicon oxide, silicon nitride, silicon oxynitride, TEOS formed oxide, PSG, BPSG, low-k dielectric material, other suitable dielectric material, or combinations thereof.

Still referring to FIG. 9, the dummy fin rings 332 may each includes a dielectric layer 333 lining along the cladding layer 331 and the base isolation ring 330. The dielectric layer 333 extends parallel with the fin ring 320, each of which forms a closed ring shape around the circuit region 200. The dummy fin rings 332 and the dielectric layer 333 are still collectively referred to as the dummy fin rings 332, since the dielectric layer 333 is a portion of the dummy fin ring 332. The dielectric layer 333 may be deposited using CVD, PVD, ALD, HDPCVD, MOCVD, RPCVD, PECVD, LPCVD, ALCVD, APCVD, other suitable methods, or combinations thereof. The dielectric layer 333 may include a low-k dielectric material such as a dielectric material including Si, 0, N, and C. Low-k dielectric material generally refers to dielectric materials having a low dielectric constant, for example, lower than that of silicon oxide (k≈3.9). After the dummy fin rings 332 are deposited, the operation 506 may perform a CMP process to planarize the top surface of the semiconductor structure 100 and to expose the cladding layer 331 and the hard mask 325.

Figure 10:
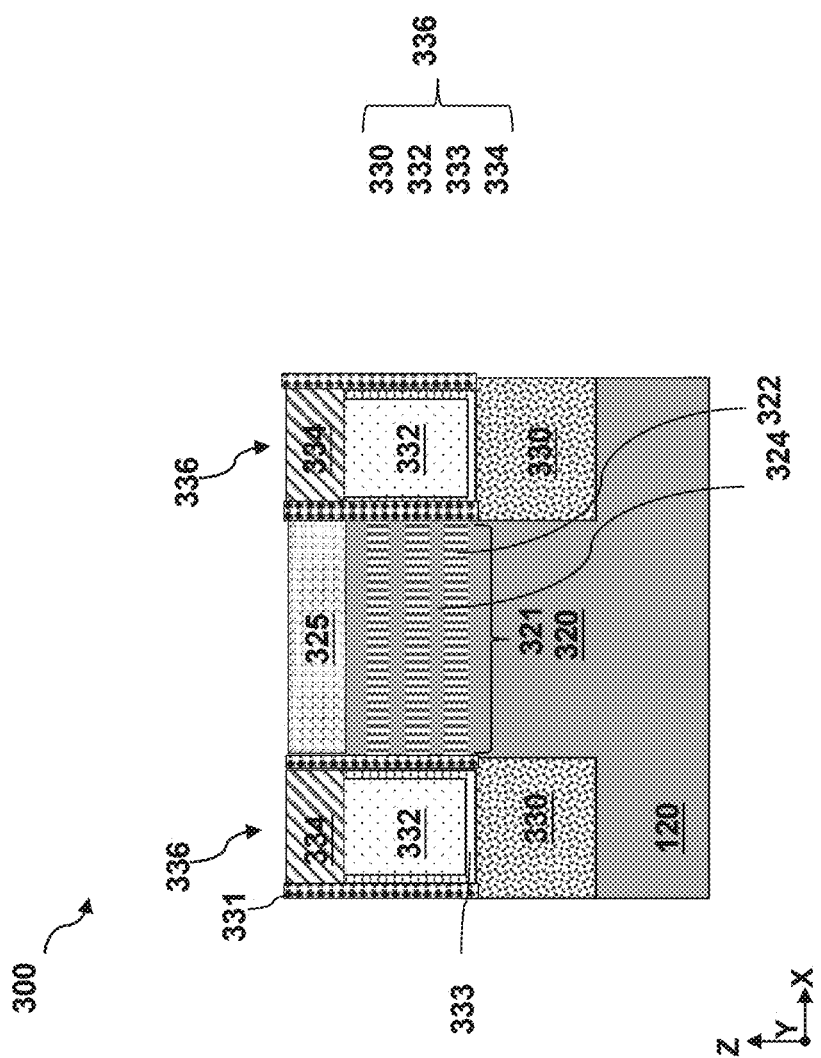

Referring to FIG. 10, the operation 506 forms dielectric helmets 334 over the dummy fin rings 332. The operation 506 recesses the dummy fin ring 332 using a selective etching process that etches the dummy fin ring 332 with no (or minimal) etching to the hard mask 325 and the cladding layer 331. Then, the operation 506 deposits one or more dielectric materials into the recesses and performs a CMP process to the one or more dielectric materials to form the dielectric helmets 334. Each of the dielectric helmets 334 extends parallel with the fin ring 320 and forms a closed ring shape around the circuit region 200. In an embodiment, the dielectric helmets 334 include a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof.

Figure 11:
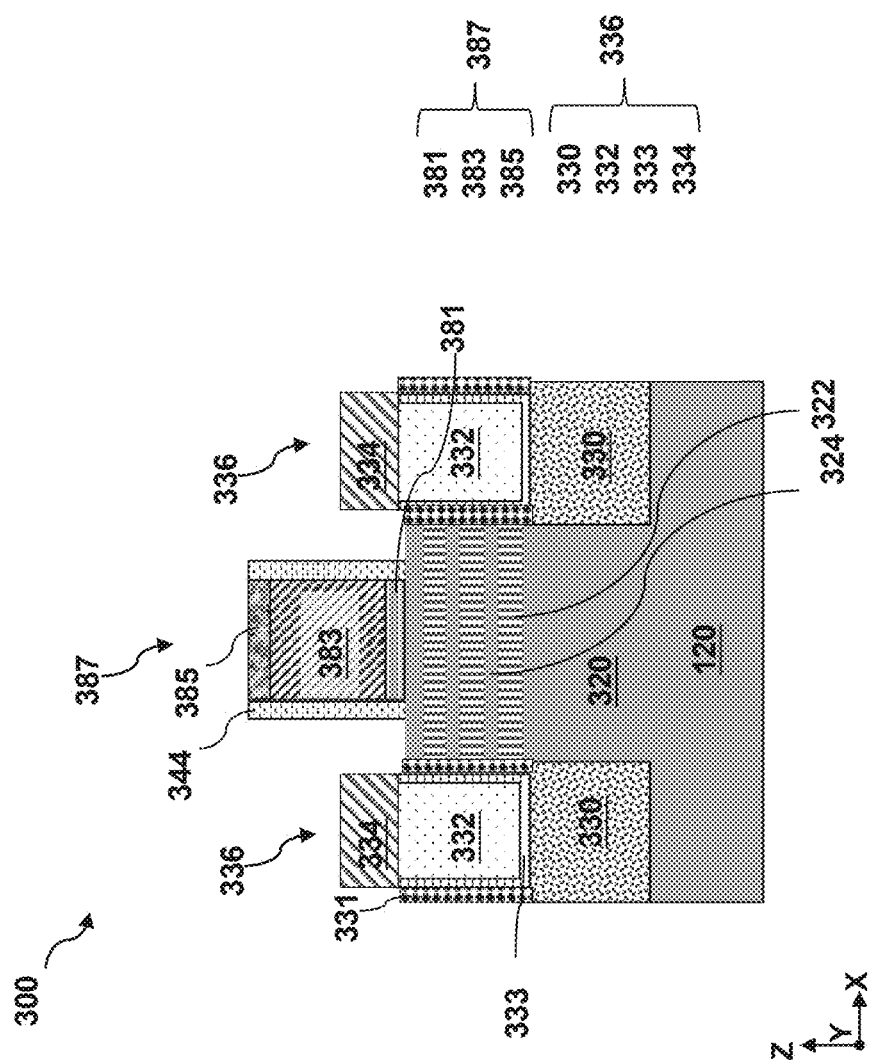

At operation 508, referring to FIGS. 5 and 11, the method 500 forms dummy gate ring (or sacrificial gate ring) 387 in the seal ring region 300. The method 500 removes the hard mask 325 and portions of the cladding layer 331 over the dummy fin rings 332. Then, the operation 508 deposits a dielectric layer 381 in the seal ring region 300. The dielectric layer 381 extends parallel to the fin ring 320 and forms a closed ring shape around the circuit region 200. The dielectric layer 381 is dummy (or sacrificial) gate dielectric layer and may include silicon oxide, a high-k dielectric material, other suitable dielectric material, or combinations thereof. Dielectric layer 381 may be deposited using any of the processes described herein, such as ALD, CVD, PVD, other suitable process, or combinations thereof.

Still referring to FIG. 11, the operation 508 deposits a poly ring 383 over the dummy gate dielectric layer 381 in the seal ring region 300. In an embodiment, the poly ring 383 includes poly silicon (or poly). Then, the operation 508 forms a hard mask layer 385 in the seal ring region 300. Then, the operation 508 performs lithography patterning and etching processes to pattern the hard mask layer 385, the poly ring 383, and the dummy gate dielectric layers 381 to form dummy gate structures 387 in the seal ring region 300. Dummy gate ring 387 includes portions of the hard mask layer 385, portions of the poly ring 383, and portions of the dummy gate dielectric layer 381. Dummy gate ring 387 is formed into a ring that surround the circuit region 200 from a top view (see FIGS. 1, 4a and 4b). Particularly, each dummy gate ring 387 is formed to be narrower than the underlying fin ring 320. The longitudinal edges of the dummy gate ring 387 are within the longitudinal edges of the fin ring 320.

Operation 508 may further form gate spacers 344 on sidewalls of dummy gate ring 387. The gate spacers 344 are formed by any suitable process and include a dielectric material. The dielectric material can include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). For example, a dielectric layer including silicon and nitrogen, such as a silicon nitride layer, can be deposited over dummy gate ring 387 and subsequently etched (e.g., anisotropically etched) to form gate spacers 344. In some embodiments, gate spacers 344 include a multi-layer structure, such as a first dielectric layer that includes silicon nitride and a second dielectric layer that includes silicon oxide.

Figure 12:
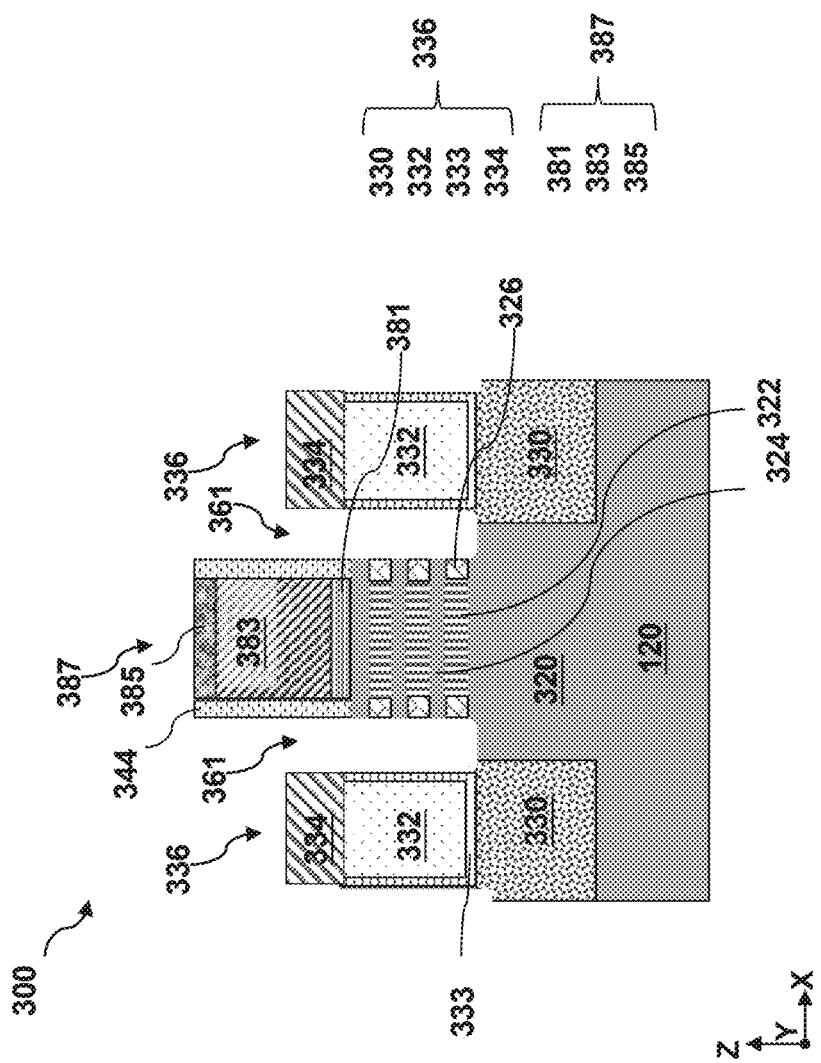

At operation 510, referring to FIGS. 5 and 12, the method 500 forms trenches 361 by etching the fin rings 320 adjacent the gate spacers 344. For example, one or more etching processes are used to remove semiconductor layers 322 and 324 of the fin ring 320 in the seal ring region 300. The etching of the semiconductor layers 322 and 324 are self-aligned to the isolation rings 336 and the gate spacers 344. The etching process can include a dry etching process, a wet etching process, other suitable etching process, or combinations thereof.

Still referring to FIGS. 5 and 12, the operation 514 further forms inner spacers 326 in seal ring region 300. For example, a first etching process is performed that selectively etches semiconductor layers 322 exposed in trenches 361 with minimal (to no) etching of semiconductor layers 324, such that gaps are formed between semiconductor layers 322 and semiconductor layer 324 under gate spacers 244. The first etching process is configured to laterally etch (e.g., along the "x" direction) semiconductor layers 322, thereby reducing a length of semiconductor layers 322 along the "x" direction. The first etching process is a dry etching process, a wet etching process, other suitable etching process, or combinations thereof. A deposition process then forms a spacer layer in the trenches 361. The deposition process is configured to ensure that the spacer layer fills the gaps discussed above. A second etching process is then performed that selectively etches the spacer layer to form inner spacers 326 as depicted in FIG. 12 with minimal (to no) etching of other surrounding material layers. In some embodiments, the inner spacer 326 includes a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the inner spacer 326 includes a low-k dielectric material, such as those described herein.

Figure 13:
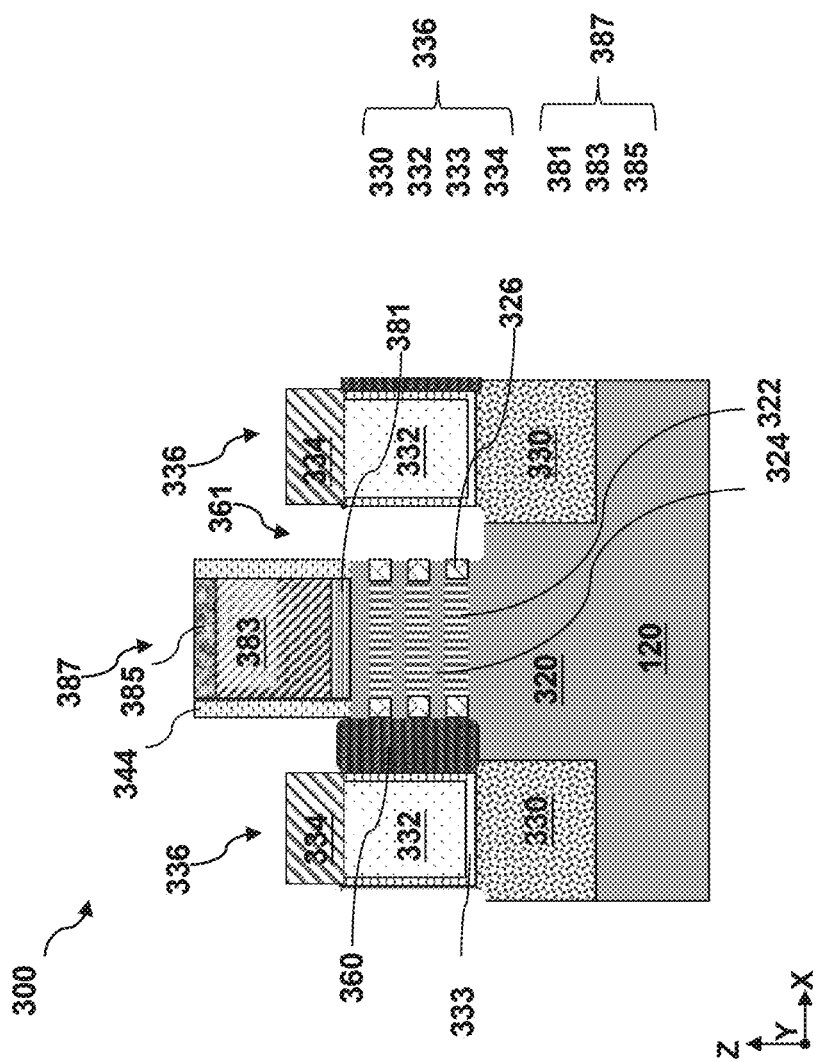

At operation 512, referring to FIGS. 5 and 13, the method 500 forms a first epitaxial ring 360 in the trenches 361 on a first side of the gate ring 340 in a first epitaxy process.

Figure 14:
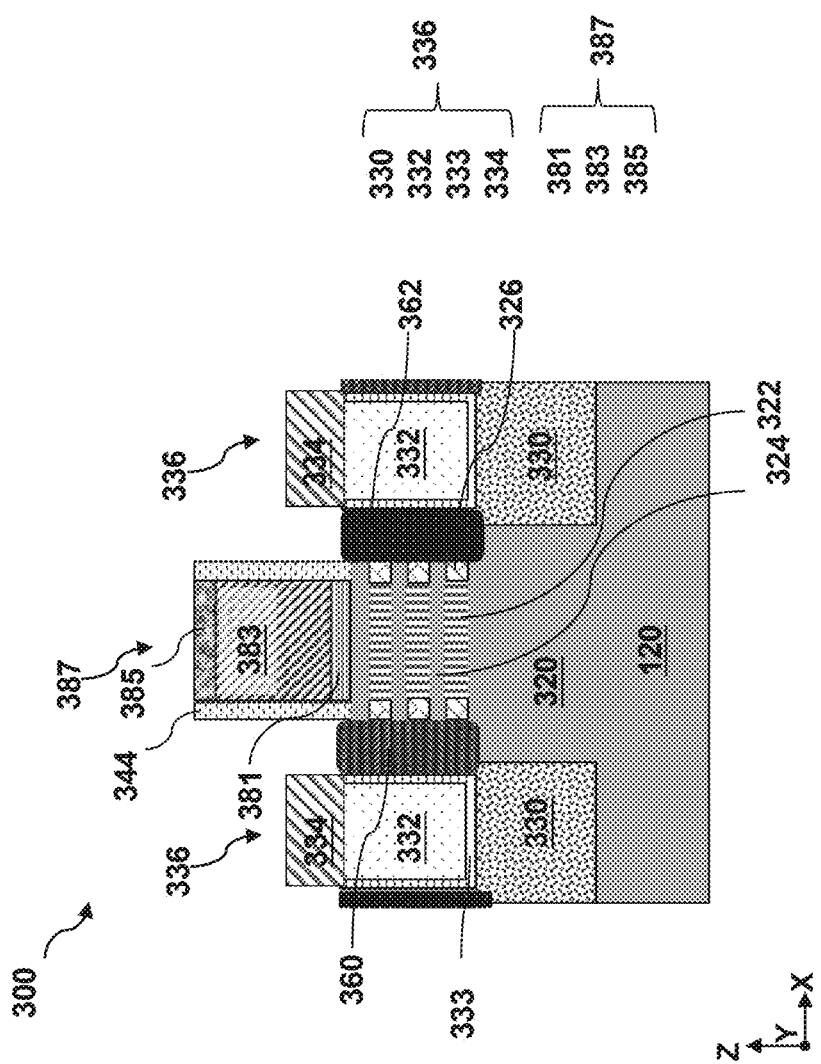

At operation 514, referring to FIGS. 5 and 14, the method 500 forms a second epitaxial ring 362 in the trenches 361 on a second side of the gate ring 340 in a second epitaxy process. The first epitaxial ring 360 includes a material different from that of the second epitaxial ring 362. The first epitaxial ring 360 is of a different type (e.g., n-type, p-type, or undoped) from the type of the second epitaxial ring 362. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of the semiconductor layers 322 and 324. The first epitaxial ring 360 and the second epitaxial ring 362 may be doped with n-type dopants or p-type dopants for n-type transistors or p-type transistors respectively. In some embodiments, the first epitaxial ring 360 and the second epitaxial ring 362 include silicon and can be doped with carbon, phosphorous, arsenic, other n-type dopant, or combinations thereof. In some embodiments, the first epitaxial ring 360 and the second epitaxial ring 362 include silicon germanium or germanium and can be doped with boron, other p-type dopant, or combinations thereof. In some embodiments, the first epitaxial ring 360 and the second epitaxial ring 362 each includes more than one epitaxial semiconductor layer.

Figure 15:
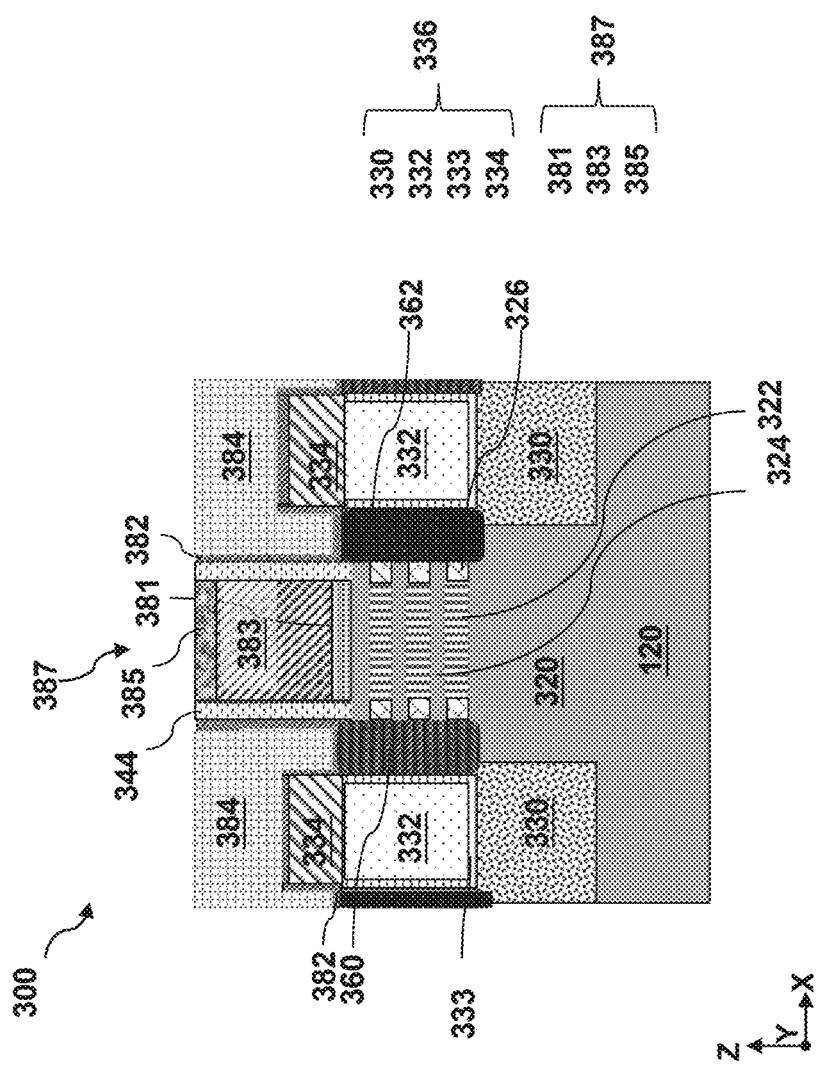

Thereafter, referring to FIGS. 5 and 15, the method 500 forms a contact etch stop layer (CESL) 382 and an interlayer dielectric (ILD) layer 384. The CESL 382 is deposited over the isolation rings 336, the first epitaxial ring 360, the second epitaxial ring 362, and on sidewalls of the gate spacers 344. The ILD layer 384 is deposited over the CESL 382 as shown in FIG. 15. The CESL 382 includes a material that is different from that of the ILD layer 384 and different from the dielectric helmets 334. The CESL 382 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layer 384 may comprise tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD 384 may be formed by PECVD (plasma enhanced CVD), FCVD (flowable CVD), or other suitable methods. Subsequent to the deposition of the CESL 382 and the ILD layer 384, a CMP process and/or other planarization process can be performed until reaching (exposing) a top portion (or top surface) of dummy gate rings 387.

Figure 16:
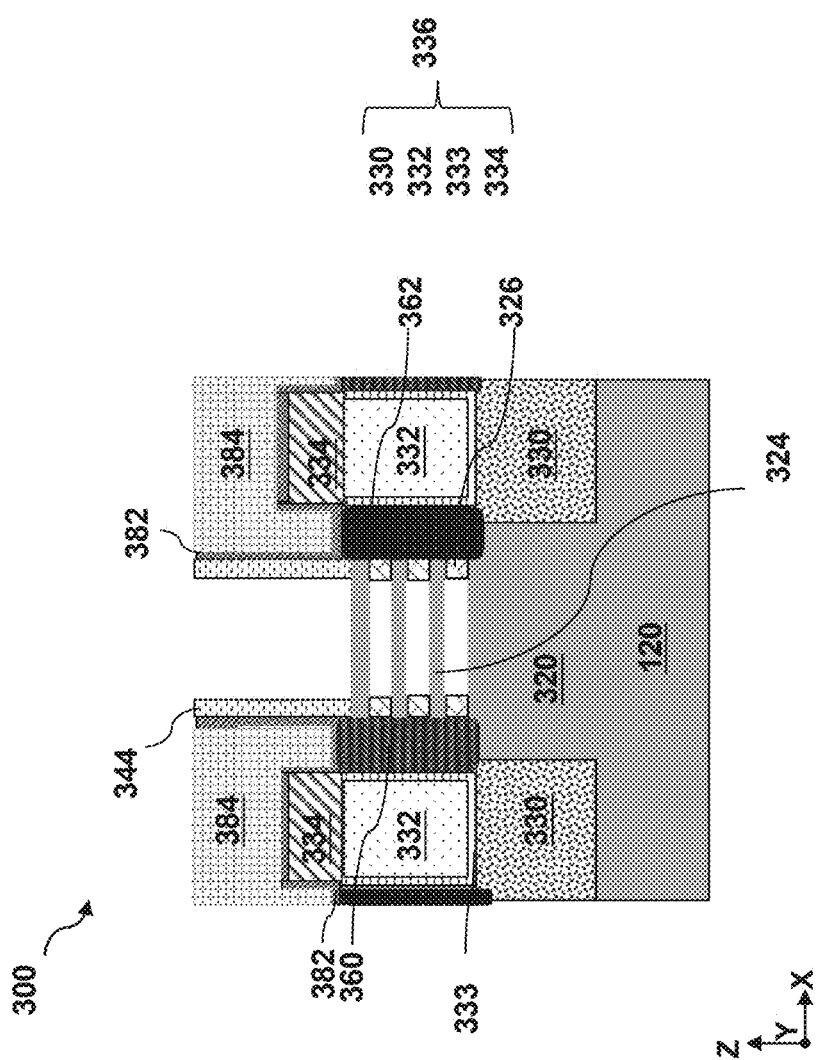
Figure 17:
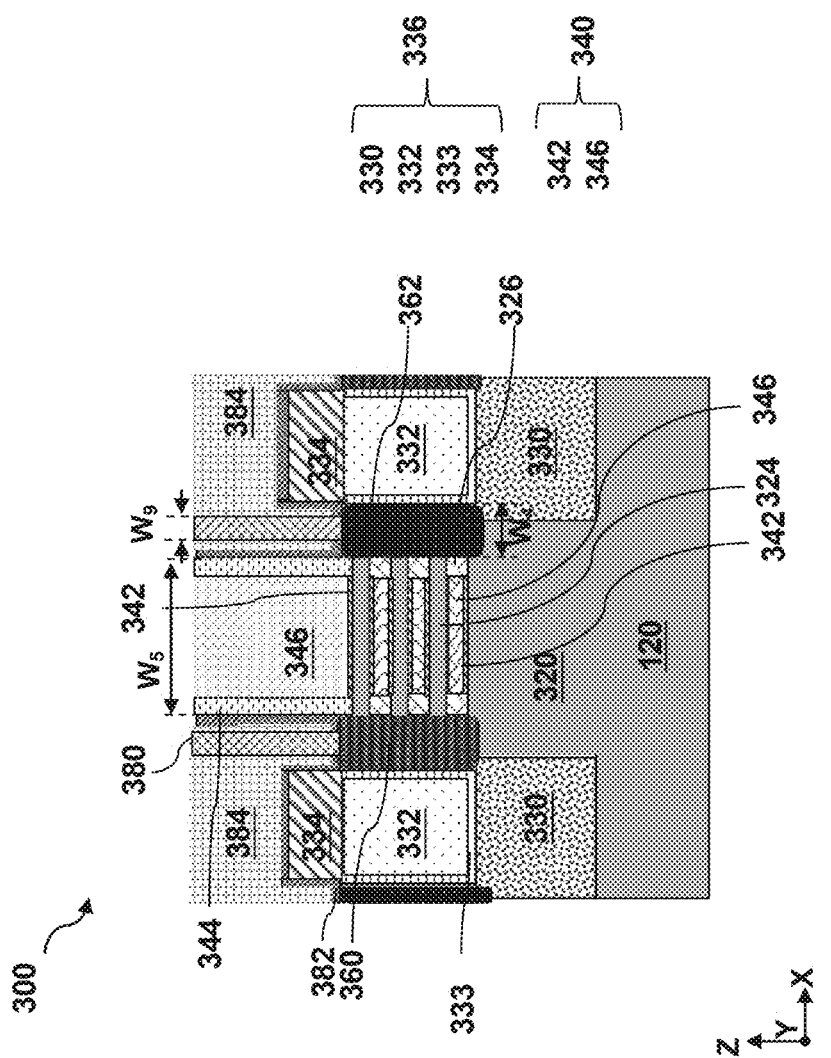

At operation 516, referring to FIGS. 5, 16, and 17, the method 500 replaces dummy gate ring 387 with gate ring 340 (also referred to as high-k metal gate ring, or metal gate ring). The gate ring 340 extends around and encloses the entire circuit region 200 to form a closed ring (or loop). The gate ring 340 includes a gate dielectric layer 342 and a gate electrode 346. The gate replacement process involves a variety of processes as briefly described below.

First, referring to FIG. 16, the operation 516 removes dummy gate ring 387 using one or more etching process, which forms gate trenches in the seal ring region 300. The etching process may be a dry etching process, a wet etching process, other suitable etching process, or combinations thereof. The etching process is configured to selectively etch dummy gate ring 387 with minimal (to no) etching of other surrounding structures, such as ILD layer 384, gate spacers 344, isolation rings 336, and semiconductor layers 322 and 324.

Next, still referring to FIG. 16, the operation 516 removes the semiconductor layers 322 exposed in the gate trenches, leaving the semiconductor layers 324 suspended and connected with the first epitaxial ring 360 and the second epitaxial ring 362. The etching process selectively etches semiconductor layers 322 with minimal (to no) etching of semiconductor layers 324, gate spacers 344, and/or inner spacers 326.

Next, referring to FIG. 17, the operation 516 forms a gate dielectric layer 342 that wraps around each of the semiconductor layers 324. The operation 516 subsequently forms a gate electrode 346 over the gate dielectric layer 342. The gate dielectric layers 342 includes a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. The gate dielectric layers 342 may be formed by chemical oxidation, thermal oxidation, atomic layer deposition (ALD), chemical vapor deposition (CVD), and/or other suitable methods. In some embodiments, the gate ring 340 further includes an interfacial layer between the gate dielectric layer 342 and the semiconductor layers 324. The interfacial layer may include silicon dioxide, silicon oxynitride, or other suitable materials. In some embodiments, the gate electrode 346 includes an n-type or a p-type work function layer and a metal fill layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. In some embodiments, the gate electrode 346 does not include a work function layer as there are no functioning transistors in the seal ring region 300. For example, the gate electrode 346 may include aluminum, tungsten, cobalt, copper, and/or other suitable materials. Various layers of the gate electrodes 346 may be formed by CVD, PVD, plating, and/or other suitable processes.

At operation 518, referring to FIGS. 5 and 17, the method 500 forms contact rings 380 disposed in the ILD 384 and landing on the first epitaxial rings 360 and the second epitaxial rings 362. The operation 518 first etches contact holes (not shown) to expose the first epitaxial rings 360 and the second epitaxial rings 362. The operation 518 subsequently forms contact rings 380 in the contact holes, such that the contact rings 380 are in direct contact with each of the first epitaxial rings 360 and the second epitaxial rings 362. The operation 518 may form silicide layer(s) (not shown) between contact ring 380 and the first epitaxial rings 360 and between contact ring 380 and the second epitaxial rings 362. The silicide layer(s) may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. The contact rings 380 include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), or other metals, and may be formed by CVD, PVD, ALD, plating, or other suitable processes.

At operation 520, still referring to FIGS. 5 and 17, the method 500 performs further fabrications in the seal ring region 300, such as performing BEOL processes. For example, the BEOL processes may form gate vias connecting to the gate ring 340, form contact vias connecting to the contact rings 380, and form one or more interconnect layers (or interconnects) with wires and vias embedded in dielectric layers. The one or more interconnect layers form part of the seal ring structure in the seal ring region 300. The method 500 may also form passivation layer(s) over the interconnect layers. The wires and vias in the interconnect layers are based on the gate rings (e.g., gate ring 340) and the contact rings (e.g., contact ring 380) in the seal ring region 300. Improving the configurations of the gate rings and the contact rings can improve the stability and reliability of the seal ring structure.

Although the components in the seal ring region 300 are formed simultaneously with and include the same materials as their counterparts in the circuit region 200, they are different in many aspects, such as in functionality, shapes and sizes. The components in the seal ring region 300 are referring to components such as the fin ring 320, the gate ring 340, the isolation ring 336, the first epitaxial ring 360, the second epitaxial ring 362, and the contact rings 380 in the seal ring region 300. The components in the circuit region 200 are referring to components such as fins, gates, isolation structures between fins, epitaxial features serve as source/drain features, and contacts in the circuit region 200. Different from the circuit region 200, the components in the seal ring region 300 are not electronically active and do not function as transistors. Instead, the components in the seal ring region 300 isolate the circuit region 200 from possible damages such as dusts, moisture, mechanical stress, and other possible damages. Each of the components in the seal ring region 300 extends around the entire circuit region 200 and forms a closed ring shape (or loop), while the components in the circuit region 200 are intersecting straight lines (FIG. 2). In addition, the widths and pitches of the components in the seal ring region 300 are wider than the widths and pitches of their counterparts in the circuit region 200.

FIGS. 17-23 are various exemplary structures of the semiconductor structure 100 of FIG. 1 in the seal ring region 300 fabricated according to the method 500 in FIG. 5. Referring to FIG. 17, the first epitaxial ring 360 and the second epitaxial ring 362 are disposed over the fin ring 320 and covers sidewalls of the semiconductor layers 324 and the inner spacers 326. A portion of the first epitaxial ring 360 and a portion of the second epitaxial ring 362 are disposed beyond the longitudinal edges of the fin ring 320 and over the base isolation rings 330.

Still referring to FIG. 17, the two contact rings 380 land on each of the first epitaxial ring 360 and the second epitaxial ring 362. A width $w_9$ of each of the contact rings 380 is less than a width $w_4$ of first epitaxial ring 360 and the second epitaxial ring 362. The longitudinal edges of the contact rings 380 are within the longitudinal edges of the corresponding first epitaxial ring 360 or second epitaxial ring 362. The two contact rings 380 disposed over the first epitaxial ring 360 and the second epitaxial ring 362 are mirrored images to each other. In some examples, only one of the first epitaxial rings 360 and the second epitaxial rings 362 has a contact ring 380 disposed thereover. Compared to one contact ring 380, two contact rings 380 provide more landing area for the later formed interconnect structure thereover, thereby improving the stability and reliability of the semiconductor structure.

Embodiments depicted in FIGS. 18-23 include only one contact ring 380 disposed over the second epitaxial ring 362 for simplicity and are not meant to be limiting. A second contact ring 380 may also be formed over the first epitaxial ring 360. The contact ring 380 over the first epitaxial ring 360 is a mirrored image of the contact ring 380 over the second epitaxial ring 362.

Figure 18:
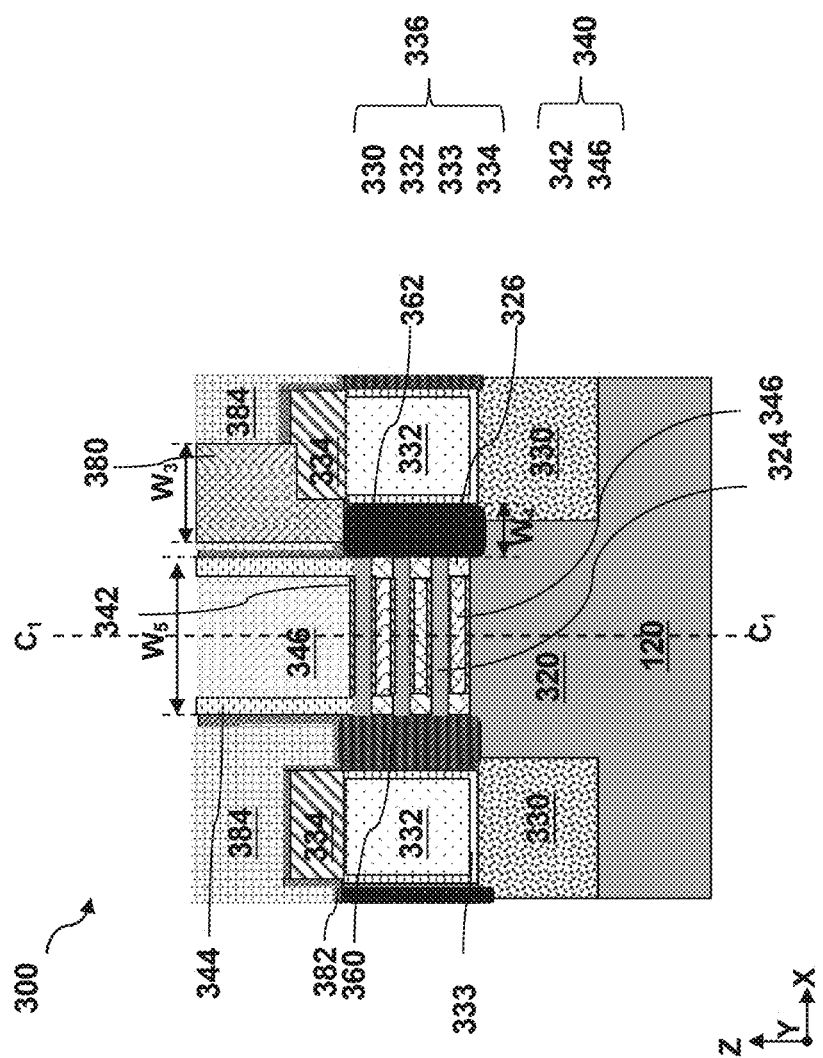
FIGS. 18, 19, 20, 21, 22, and 23 are cross-sectional views of the semiconductor structure in FIG. 1, according to various embodiments of the present disclosure.

Referring to FIG. 18, the contact ring 380 lands on the second epitaxial ring 362. Portions of the ILD 384 and CESL 382 over the second epitaxial ring 362 and over sidewalls and top surface of the dielectric helmet 334 are removed in the operation 518, thereby forms a contact hole (not shown) exposing the second epitaxial ring 362 and the dielectric helmet 334 therein. The contact ring 380 is then formed in the contact hole. A portion of the contact ring 380 is disposed over but not in direct contact with the fin ring 320. The contact ring 380 has a stepped bottom surface contouring the top surfaces of the second epitaxial ring 362 and the dielectric helmets 334. The width $w_3$ of the contact ring 380 is greater than the width $w_4$ of the second epitaxial ring 362. The width $w_3$ is wider than the width $w_9$ in the embodiments depicted in FIG. 17. The widened width of the contact ring 380 improves the landing of the interconnects thereover, and thereby improves the stability and the reliability of the seal ring structure. In the depicted embodiments, the center line $c_1$-$c_1$ of the fin ring 320 overlaps with the center line $c_2$-$c_2$ (not shown) of the gate ring 340.

Referring to FIGS. 5 and 19, the operation 512 (forming of the first epitaxial ring 360) is omitted from the method 500 in the seal ring region 300. The operation 512 is only performed in the circuit region 200. In the depicted embodiments, the center line $c_2$-$c_2$ of the gate ring 340 is shifted to the left (the direction away from the circuit region 200) from the center line $c_1$-$c_1$ of the fin ring 320. A width $w_6$ of the gate ring 340 in FIG. 19 is less than a width $w_5$ in FIG. 18. The narrower width $w_6$ provides room for the second epitaxial ring 362, for example, a width $w_7$ in FIG. 19 is greater than the width $w_4$ in FIG. 18. The wider second epitaxial ring 362 in turn enable a wider contact ring 380 disposed thereover, for example, the width $w_8$ in FIG. 19 is greater than the width $w_3$ in FIG. 18. The wider second epitaxial ring 362 and the wider contact ring 380 provide wider and thereby more stable and reliable base for the seal ring structure. The left sidewalls (the side away from the circuit region 200) of the semiconductor layers 322 and 324 are vertically aligned with the base of the fin ring 320 and contacting a remaining portion of the cladding layer 331. In the embodiments depicted in FIG. 19, the portions of the CESL 382 over the dielectric helmet 334 are intact. The contact rings 380 are formed over the CESL 382 without in direct contact with the dielectric helmet 334.

Figure 20:
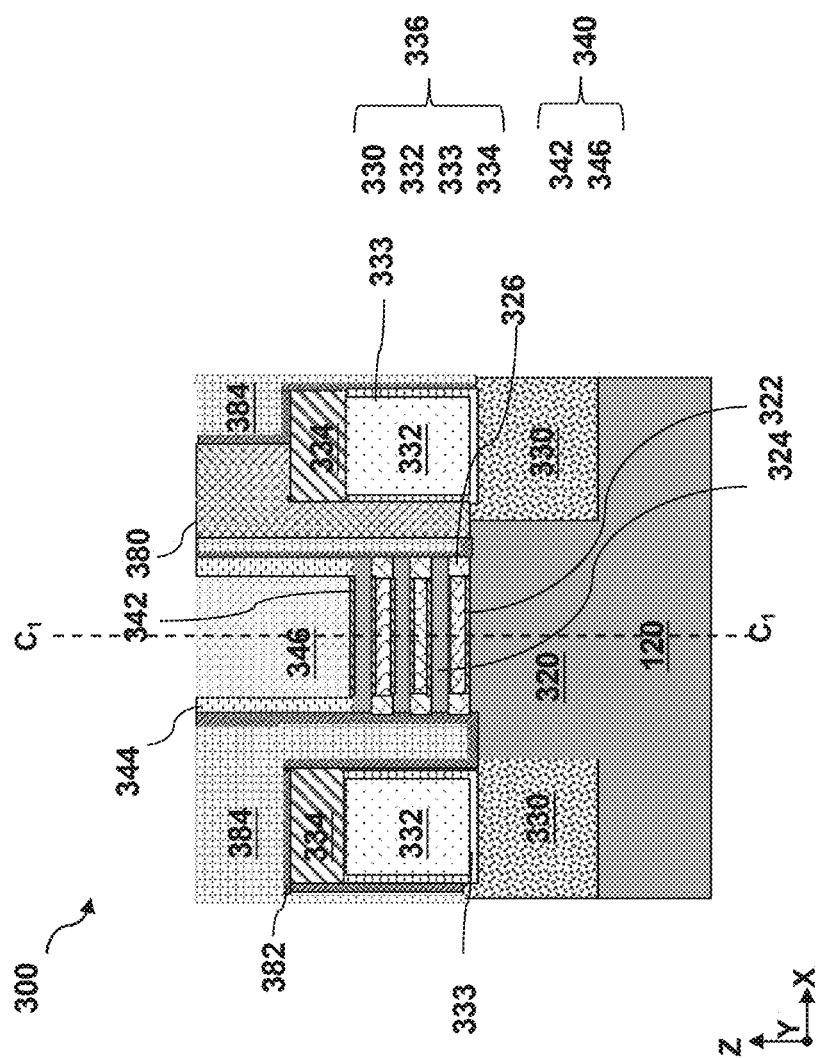

Referring to FIGS. 5 and 20, the operations 512 and 514 (the forming of the first epitaxial ring 360 and the forming of the second epitaxial ring 362) are both omitted from the method 500 in the seal ring region 300. The operations 512 and 514 are performed only in the circuit region 200. The center line $c_2$-$c_2$ of the gate ring 340 (not shown) overlaps with the center line $c_1$-$c_1$ of the fin ring 320. The contact ring 380 extends to and directly contacts the base isolation ring 330 and the portion of the fin ring 320 under the semiconductor layers 324. The contact ring 380 directly contacts the dielectric layer 333 of the dummy fin ring 332 and the sidewall and top surface of the dielectric helmet 334. The CESL 382 and the ILD 384 separate the contact ring 380 from contacting the gate spacer 344, the inner spacers 326, and the semiconductor layers 324. The extended contact ring 380 is more stable than the contact rings disposed over the second epitaxial rings 362 (FIG. 18), thereby improving the reliability and stability of the seal ring structure. In addition, the omitting of the operation 512 and 514 avoids the otherwise possible damages to the structure during the operations 512 and 514, such as over etching, which also improves the stability and the reliability of the seal ring structure.

Figure 21:
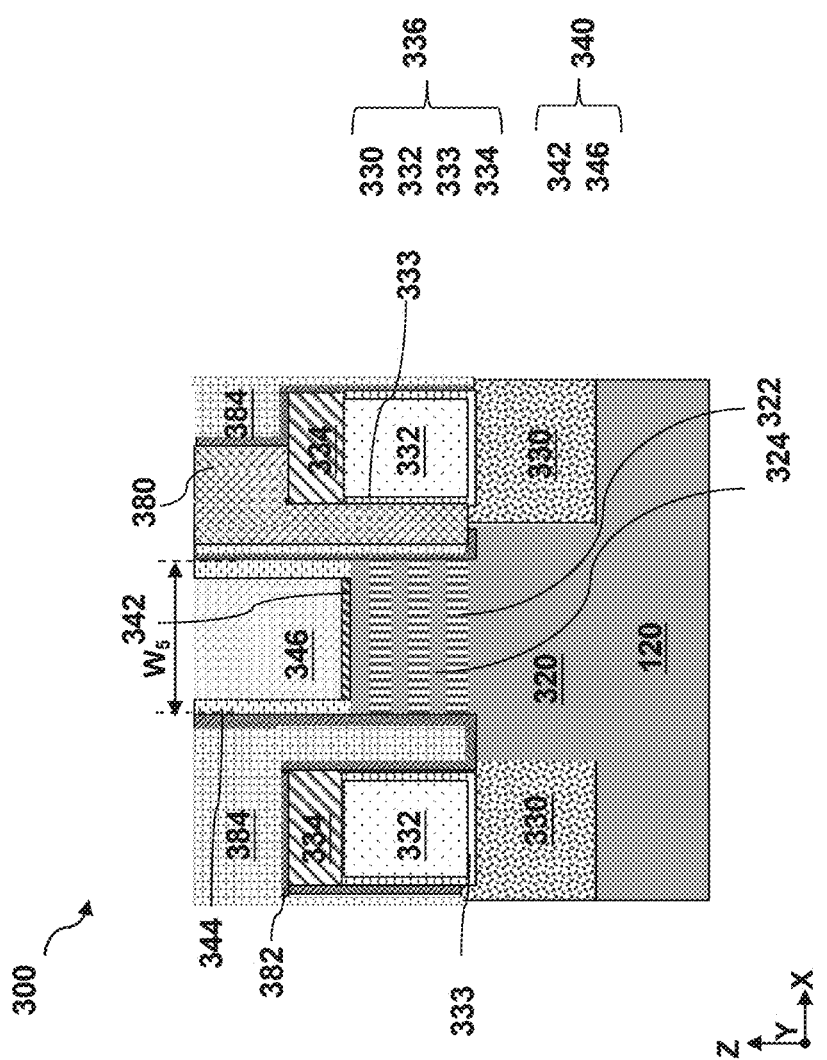

Referring to FIGS. 5 and 21, the operation 512 (the forming of the first epitaxial ring 360), 514 (the forming of the second epitaxial ring 362), and sheet release process in the operation 516 (the replacing of the dummy gate ring) are omitted from the method 500 in the seal ring region 300. The operation 512, 514, and sheet release process in the operation 516 are only performed in the circuit region 200. As such, the semiconductor layers 322 and 324 are kept intact in the seal ring region 300. The later formed gate ring 340 is over the topmost semiconductor layer 324. The omitting of the sheet formation process reduced the otherwise possible damages to the seal ring region 300, such as over etching.

Figure 22:
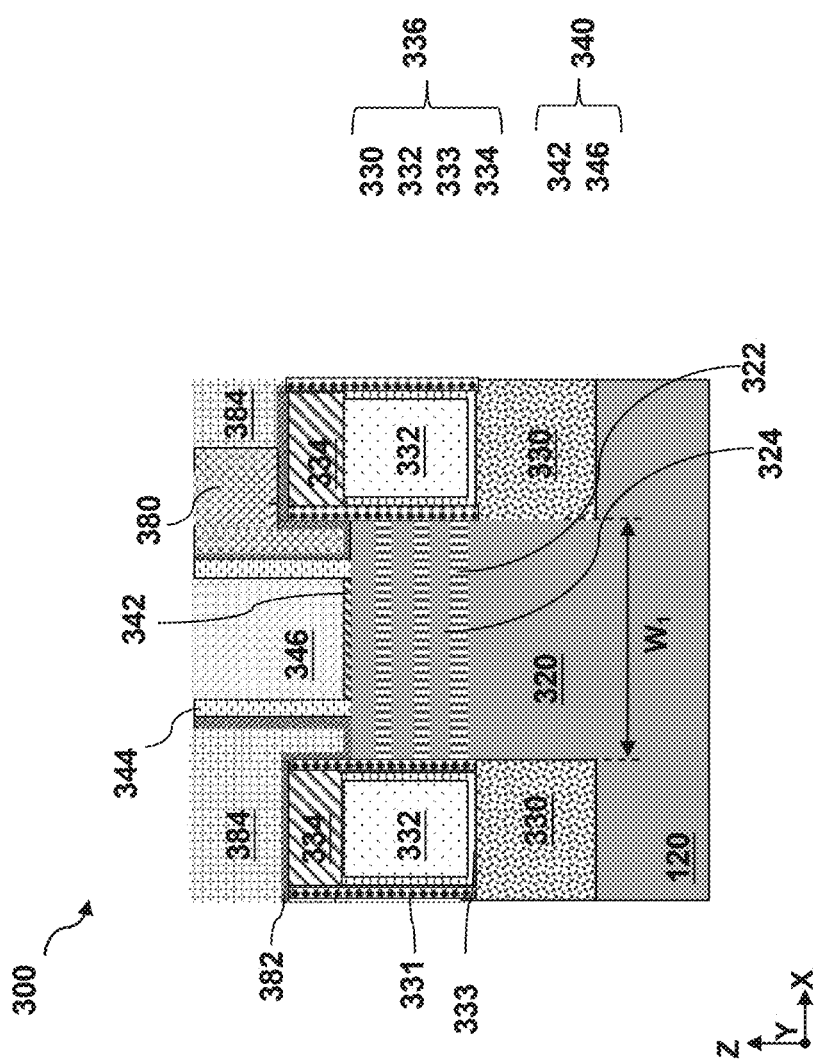

Referring to FIGS. 5 and 22, the operations 510 (the forming of the trenches in the fin ring 320), 512 (the forming of the first epitaxial ring 360), and 514 (the forming of the second epitaxial ring 362) are omitted from the method 500 in the seal ring region 300. The operation 510, 512, and 514 are only performed in the circuit region 200. The fin ring 320 (including the semiconductor layers 324 and 322) has the same width $w_1$ along the z direction. The cladding layer is kept on sidewalls of the dummy fin rings 332 and the dielectric helmets 334. The contact ring 380 lands on the topmost semiconductor layer 324 and the dielectric helmet 334, with the CESL 382 disposed therebetween. In the depicted embodiments, the contact ring 380 and the gate spacer 344 are separated by the CESL 382 only. In other words, the contact ring 380 is in direct contact with the CESL 382.

Referring to FIGS. 5 and 23, the forming of the dummy fin ring 332 and the dielectric helmets 334 in the operation 506 (the forming of the isolation ring), the operations 510 (the forming of the trenches in the fin ring 320), 512 (the forming of the first epitaxial ring 360), and 514 (the forming of the second epitaxial ring 362) are omitted from the method 500 in the seal ring region 300. The forming of the dummy fin ring 332 and the dielectric helmets 334 in the operation 506, the operations 510, 512, and 514 are performed only in the circuit region 200. The base isolation ring 330 is kept to the same height (measured along the z direction) as the fin ring 320, thereby providing substantial coplanar top surfaces with the topmost semiconductor layer 324. The coplanar top surfaces provide flexible design choices, simpler processing, and more processing error tolerance for the forming of the gate ring 340 and the contact ring 380. For example, the width and center lines of the gate ring 340 and the contact ring 380 are no longer limited by the center line $c_1$-$c_1$ of the fin and the dielectric helmet.

Although not intended to be limiting, embodiments of the present disclosure provide one or more of the following advantages. For example, embodiments of the present disclosure provide a semiconductor structure with a seal ring region. The seal ring region is formed using a process that is compatible with GAA fabrication process. In an embodiment, the seal ring region includes a stack of semiconductor rings and a gate ring disposed thereover, where the gate ring is narrower than the stack. In another embodiment, the seal ring region includes an isolation ring adjacent to the stack and a contact ring landing on the isolation ring and the stack. In a further embodiment, the contact ring contacts sidewalls of the stack. In a still further embodiment, the seal ring region includes an epitaxial ring over sidewalls of the stack, where the contact ring lands on the epitaxial ring and the isolation ring. Embodiments of the present disclosure can be readily integrated into existing semiconductor manufacturing processes.

In one example aspect, the present disclosure is directed to a semiconductor structure. The semiconductor structure includes a substrate; and a seal ring region enclosing a circuit region disposed over the substrate. The seal ring region further includes a fin ring protruding from the substrate having a first width; an isolation ring disposed over the substrate and adjacent to the fin ring; a gate ring disposed over the fin ring having a second width, wherein the second width is less than the first width; an epitaxial ring disposed between the fin ring and the isolation ring; and a contact ring lands on the epitaxial ring and the isolation ring. Each of the fin ring, the isolation ring, the epitaxial ring, and the contact ring extends parallel to each other and fully surrounds the circuit region to form a closed loop.

In another example aspect, the present disclosure is directed to a semiconductor structure. The semiconductor structure includes a substrate including a seal ring region enclosing a circuit region. The seal ring region further includes a fin ring including a stack of alternating first semiconductor layers and second semiconductor layers over the substrate, wherein the fin ring encloses the circuit region; a gate ring landing on the fin ring, wherein the gate ring surrounds the circuit region, and wherein longitudinal edges of the gate ring are within longitudinal edges of the fin ring from a top view; and a contact ring partially landing on the fin ring, wherein the contact ring encloses the circuit region.

In yet another example aspect, the present disclosure is directed to a method of semiconductor fabrication. The method includes providing a semiconductor substrate including a seal ring region enclosing a circuit region; forming a stack ring including first semiconductor layers and second semiconductor layers alternatively stacked over the semiconductor substrate, the stack ring having a first top surface; forming an isolation ring adjacent to the stack ring over the semiconductor substrate, the isolation ring having a second top surface; forming a gate ring disposed over the stack ring, wherein the gate ring covers a portion of the first top surface and longitudinally extends along the entire stack ring; and forming a contact ring over the stack ring and the isolation ring. The contact ring covers a portion of the second top surface. The stack ring, the isolation ring, the gate ring, and the contact ring each forms a closed ring shape in the seal ring region enclosing the circuit region.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate; and
   a seal ring region enclosing a circuit region disposed over the substrate, wherein the seal ring region comprises:

a fin ring protruding from the substrate having a first width;

an isolation ring disposed over the substrate and adjacent to the fin ring;

a gate ring disposed over the fin ring having a second width, wherein the second width is less than the first width;

an epitaxial ring disposed between the fin ring and the isolation ring; and a contact ring lands on the epitaxial ring and the isolation ring, wherein each of the fin ring, the isolation ring, the epitaxial ring, and the contact ring extends parallel to each other and fully surrounds the circuit region to form a closed loop.

2. The semiconductor structure of claim 1, wherein the contact ring has a third width, wherein the third width is greater than or equals to the second width, and wherein longitudinal edges of the gate ring and a first longitudinal edge of the contact ring are between longitudinal edges of the fin ring, and wherein a second longitudinal edge of the contact ring is outside the longitudinal edges of the fin ring.

3. The semiconductor structure of claim 1, wherein the epitaxial ring has a top surface lower than a top surface of the isolation ring, and wherein the contact ring has a stepped bottom profile contouring a top surface of the epitaxial ring and the top surface of the isolation ring.

4. The semiconductor structure of claim 1, wherein the fin ring includes a stack of alternately stacked first semiconductor layers and second semiconductor layers, wherein a portion of the contact ring is vertically aligned with the fin ring along z direction.

5. The semiconductor structure of claim 4, wherein the epitaxial ring contacts sidewalls of the first semiconductor layers and the second semiconductor layers.

6. The semiconductor structure of claim 1, wherein the contact horizontally spans from the fin ring to the isolation ring.

7. A semiconductor structure, comprising:

a substrate including a seal ring region enclosing a circuit region, wherein the seal ring region comprises:

a fin ring including a stack of alternating first semiconductor layers and second semiconductor layers over the substrate, wherein the fin ring encloses the circuit region;

a gate ring landing on the fin ring, wherein the gate ring surrounds the circuit region, and wherein longitudinal edges of the gate ring are within longitudinal edges of the fin ring from a top view; and a contact ring partially landing on the fin ring, wherein the contact ring encloses the circuit region.

8. The semiconductor structure of claim 7, further comprising an isolation ring adjacent to the fin ring, wherein the contact ring partially lands on the isolation ring.

9. The semiconductor structure of claim 7, further comprising an epitaxial ring disposed on a sidewall of the stack.

10. The semiconductor structure of claim 9, wherein the first semiconductor layers are silicon layers and the second semiconductor layers are silicon germanium layers.

11. The semiconductor structure of claim 10, wherein the epitaxial ring contacts the silicon layers and the silicon germanium layers.

12. The semiconductor structure of claim 10, further comprising an isolation ring disposed over the substrate and adjacent to the fin ring, wherein the contact ring has a stepped bottom profile contouring a top surface of the epitaxial ring and the top surface of the isolation ring.

13. The semiconductor structure of claim 12, wherein the epitaxial ring has a top surface lower than a top surface of the isolation ring.

14. The semiconductor structure of claim 7, wherein the fin ring spans a first width between two longitudinal fin edges;

the gate ring spans a second width between two longitudinal gate edges; and the second width is less than the first width.

15. The semiconductor structure of claim 14, wherein the two longitudinal gate edges are disposed between the two longitudinal fin edges.

16. The semiconductor structure of claim 14, wherein the contact ring has a third width, wherein the third width is equals to the second width;

a first longitudinal edge of the contact ring is between the two longitudinal fin edges; and a second longitudinal edge of the contact ring is outside the two longitudinal fin edges.

17. The semiconductor structure of claim 1, wherein the isolation ring includes a shallow trench isolation (STI) structure of silicon oxide, a dielectric fin disposed and of a low-k dielectric material over the STI structure; and a dielectric helmet of a high-k dielectric material over the dielectric fin.

18. A semiconductor structure, comprising:

a substrate; and a seal ring region enclosing a circuit region disposed over the substrate, wherein the seal ring region comprises:

a fin ring protruding from the substrate having a first width, wherein the seal ring region includes a stack of alternating first semiconductor layers of a first semiconductor material and second semiconductor layers of a second semiconductor material, the second semiconductor material being different from the first semiconductor material in composition;

an isolation ring disposed over the substrate and adjacent to the fin ring;

a gate ring disposed over the fin ring having a second width, wherein the second width is less than the first width;

an epitaxial ring disposed between the fin ring and the isolation ring; and a contact ring lands on the epitaxial ring and the isolation ring, wherein each of the fin ring, the isolation ring, the epitaxial ring, and the contact ring extends parallel to each other and fully surrounds the circuit region to form a closed loop.

19. The semiconductor structure of claim 18, wherein the contact ring has a third width, wherein the third width is greater than or equals to the second width, and wherein longitudinal edges of the gate ring and a first longitudinal edge of the contact ring are between longitudinal edges of the fin ring, and wherein a second first longitudinal edge of the contact ring is outside the longitudinal edges of the fin ring.

20. The semiconductor structure of claim 19, wherein the epitaxial ring has a top surface lower than a top surface of the isolation ring, and wherein the contact ring has a stepped bottom profile contouring the top surface of the epitaxial ring and the top surface of the isolation ring.

* * * * *